United States Patent
Joo

(10) Patent No.: US 7,885,137 B2
(45) Date of Patent: Feb. 8, 2011

(54) CONTROL CIRCUIT OF FLASH MEMORY DEVICE AND METHOD OF OPERATING THE FLASH MEMORY DEVICE

(75) Inventor: Seok-Jin Joo, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 432 days.

(21) Appl. No.: 11/967,135

(22) Filed: Dec. 29, 2007

(65) Prior Publication Data

US 2008/0270679 A1    Oct. 30, 2008

(30) Foreign Application Priority Data

Apr. 24, 2007    (KR)    .................... 10-2007-0039715

(51) Int. Cl.
*G11C 7/00*    (2006.01)

(52) U.S. Cl. ............ 365/230.03; 711/103; 365/185.33; 365/189.011

(58) Field of Classification Search ................ 711/103; 365/185.33, 189.011, 230.03

See application file for complete search history.

(56) References Cited

U.S. PATENT DOCUMENTS

| | | | |
|---|---|---|---|
| 6,285,596 B1 | 9/2001 | Miura et al. | |
| 6,469,343 B1 | 10/2002 | Miura et al. | |
| 6,605,839 B2 | 8/2003 | Miura et al. | |
| 6,836,834 B2 * | 12/2004 | Schulze et al. | ............. 711/200 |
| 6,903,963 B2 | 6/2005 | Hidaka | |
| 7,136,306 B2 | 11/2006 | Xue et al. | |
| 7,149,125 B1 | 12/2006 | Thomas | |
| 7,532,495 B2 * | 5/2009 | Youn et al. | .................... 365/63 |

\* cited by examiner

*Primary Examiner*—Jasmine Song
(74) *Attorney, Agent, or Firm*—Townsend and Townsend and Crew LLP

(57) ABSTRACT

Provided is a method of operating a flash memory device having a first area and a second area, in which a programmed state and an erased state of the first area are opposite to that of the second area. The method includes receiving a program command, inverting the program data when the received program command is a command for programming the second area, and programming the inverted program data into the second area.

15 Claims, 6 Drawing Sheets

CONTROL CIRCUIT OF FLASH MEMORY DEVICE AND METHOD OF OPERATING THE FLASH MEMORY DEVICE

CROSS-REFERENCES TO RELATED APPLICATIONS

The present application claims priority to Korean patent application number 10-2007-0039715, filed on Apr. 24, 2007, which is incorporated by reference in its entirety.

BACKGROUND OF THE INVENTION

The present invention relates to a flash memory device, and more particularly to a control circuit of a flash memory having a data area and a file allocation table (FAT) area, and a method of operating the flash memory device.

In flash memory devices, an erase/write (E/W) cycling characteristic is an important factor in reliability. The E/W cycling characteristic is used in determining a physical limitation in the number of erase operations and program operations of a flash memory device. This physical limitation is further increased with higher densities of a flash memory device. Recently, a multi-level cell (MLC) technology has been proposed. In the MLC technology, a cell state is divided into more than two states and 2 or more bits of data can be stored in a single cell. However, as the MLC technology is applied to the flash memory devices, the limitation in the E/W cycles becomes more serious.

The localized E/W cycling stress can be reduced by appropriately allocating locations where data are to be written. That is, if data are sequentially written, the E/W cycling stress is concentrated on a previous block. The E/W cycling stress at a specific location can be reduced by writing data at several locations in a uniform manner. This method can reduce the concentration of the E/W stress at the specific block. Hence, the E/W cycling limitation problem that most blocks encounter can be solved to some degree.

The above-described method is effective in the data area but ineffective in the FAT area. The data area refers to a memory area where data are stored, and the FAT area refers to a memory area where information such as location of data within the data area are stored. Therefore, an erase operation is performed on the data area only when new data are written. On the other hand, a data update operation must be performed on the FAT area whenever a data state in the data area is changed. Therefore, the FAT area is more vulnerable to the E/W cycling stress than the data area.

The vulnerability to the E/W cycling stress in the FAT area becomes more serious when operation schemes are different. In the flash memory device, a program operation is performed on a page basis, while an erase operation is performed on a block basis. A plurality of pages define one block. In the data area, an erased state is indicated by "1", which means that a current flows because the erased state has a negative threshold voltage. A programmed state is indicated by "0", which means that no current flows because the programmed state has a positive threshold voltage. That is, the state of "1" represents that no data is written. Therefore, in the case of the data area, an additional program has only to be performed on a page basis whenever new data are added. On the other hand, the convention for the FAT area is opposite to that of the data area because of compatibility with other systems, e.g., an operating system. That is, an erased state is indicated by "0" and the programmed state is indicated by "1". Therefore, when some data are added, an erase operation is performed to change some regions of the FAT area from the "0" state to the "1" state. However, since the erase operation is performed on a block basis, it is impossible to perform the erase operation on only the needed regions. That is, the erase operation is performed over the FAT area and the program operation is then performed to update data.

For these reasons, the E/W cycling characteristic tends to be more important in the FAT area than in the data area. As illustrated in FIG. 1, as the E/W cycling stress increases, an amount of a current flowing within cells gradually decreases. More specifically, when all cells in FIG. 1 are programmed, a drain current level in a fresh state 110 is sufficiently higher than a sensing level 100, but a state 120 after the cycling is so low that it is close to the sensing level 100. Even though unit cells are alternately programmed, a drain current level in a fresh state 130 is sufficiently higher than the sensing level 100, but a state 140 after the cycling is so low that the gap from the sensing level 100 is reduced. Generally, a smallest amount of cell current flows when all cells are programmed. As illustrated in FIG. 1, an over-program problem may be caused when a current level becomes lower than the sensing level of the page buffer due to the E/W cycling stress.

BRIEF SUMMARY OF THE INVENTION

In one embodiment, there is provided a method of operating a flash memory device having a first area and a second area, a programmed state and an erased state of the first area being opposite to that of the second area. The method includes: receiving a program command; inverting the program data when the received program command is a command for programming the second area; and programming the inverted program data into the second area.

In another embodiment, there is provided a control circuit of a flash memory device including a cell array having a first area and a second area, a programmed state and an erased state of the first area being opposite to those of the second area. The control circuit includes: a flag cell; a flag cell page buffer configured to control an operation of the flag cell; a main page buffer configured to control an operation of the cell array; and a data inverter configured to invert data inputted to the main page buffer under a predetermined condition.

DESCRIPTION OF SPECIFIC EMBODIMENTS

Figure 1:
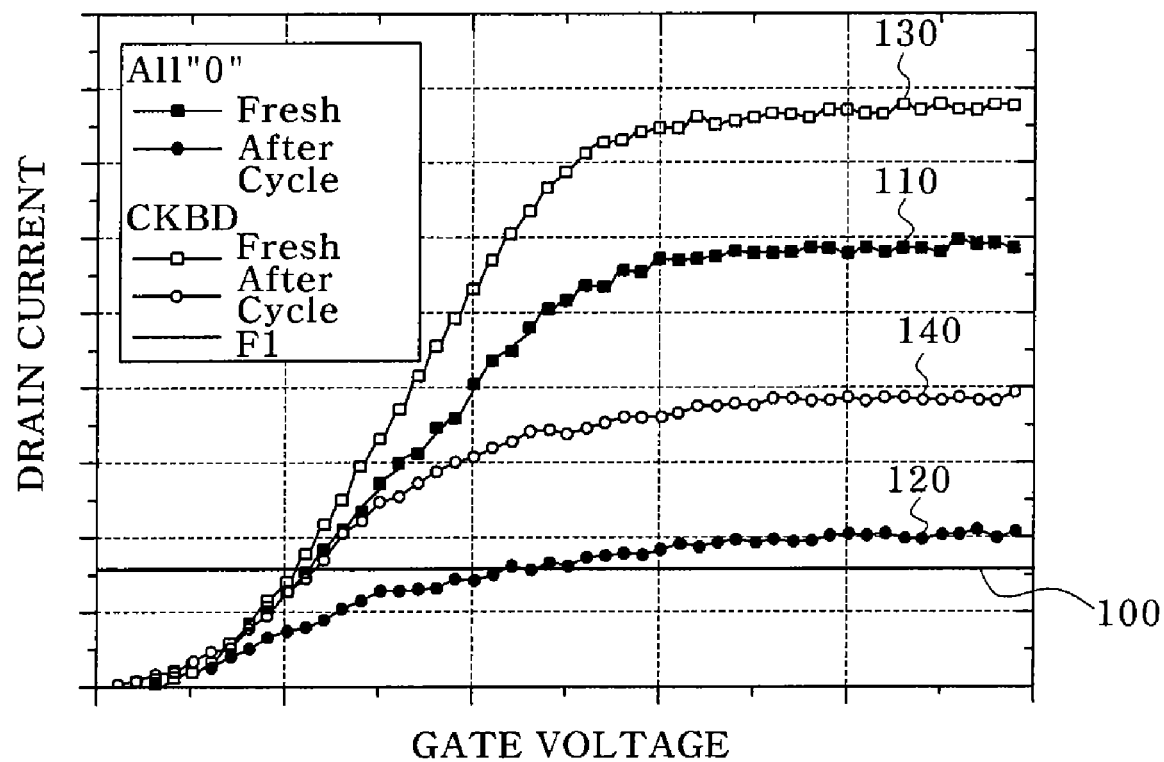
FIG. 1 illustrates the variation of a drain current in a fresh state and after cycling in a flash memory device.
Figure 2:
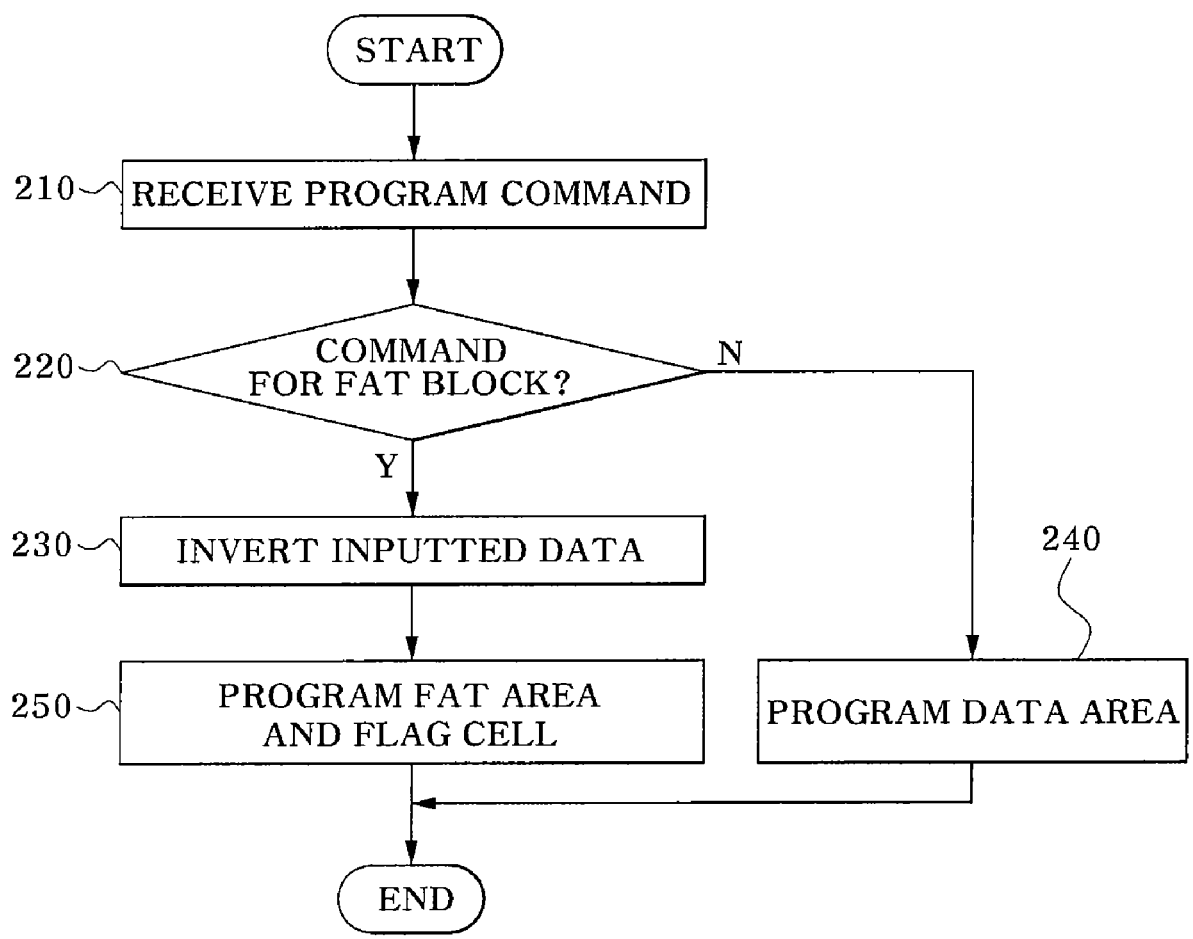
FIG. 2 illustrates a flowchart of a method of operating a flash memory device according to an embodiment of the present invention.

FIG. 2 illustrates a flowchart of a program operation of a flash memory device according to an embodiment of the present invention. Referring to FIG. 2, when a program command is inputted (step 210), the flash memory device determines if the inputted program command is a command for programming a FAT block (step 220). The program command includes a command for programming a FAT block and a command for programming a data area. In the data area, a programmed state and an erased state are indicated by "0" and "1", respectively. In the FAT block, a programmed state and an erased state are indicated by "1" and "0", respectively. Although this embodiment relates to the FAT block, the present invention can also be applied to other areas in which the programmed state and the erased state are indicated by "1" and "0".

At step 240, the data area is programmed when the inputted program command is the command for programming the data area in step 220. That is, data inputted through a page buffer is programmed into a designated page of a cell array. At step 230, when the inputted program command is the command for programming the FAT block in step 220, data is inverted and inputted into the page buffer. At step 250, the inverted data is programmed into the FAT area. As described above, "0" in the FAT area indicates that no data are written, that is, the FAT area is in an erase state. Therefore, an erase operation is first performed on a previous block whenever data is inputted. According to the present embodiment, the inversion of the incoming data makes it unnecessary to perform the erase operation on the previous block. Meanwhile, the data is inverted before data output even in the read operation. Therefore, upon programming the FAT block, the corresponding information is separately stored in a flag cell. When a read operation is performed on the FAT block according to the corresponding information, the data is inverted again before its output. In this way, the information indicating that the program operation has been performed on the FAT block can be stored in a flag cell. That is, upon programming the FAT block, the flag cell is also programmed. Thereafter, when a read command is received, it is determined whether or not the flag cell has been programmed. If the flag cell is in a programmed state, the read command is deemed to be related to a read operation on the FAT block. As a result, the data is inverted and then outputted. On the other hand, if it is determined that the flag cell is in a non-programmed state, the read command is deemed to be related to a read operation on the data area. Thus, the data is outputted without inversion.

Figure 3:
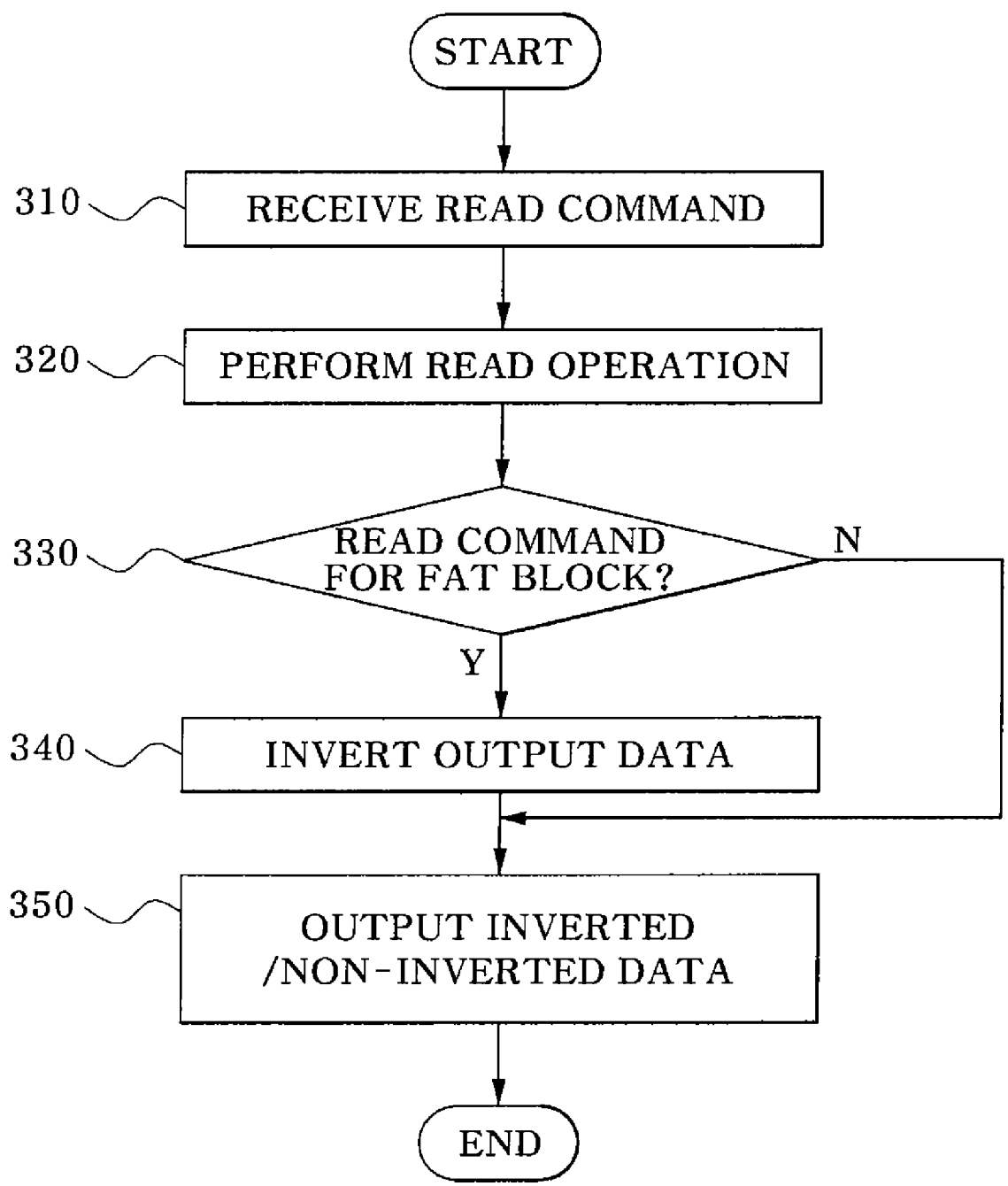
FIG. 3 illustrates a flowchart of a read operation of a flash memory device according to an embodiment of the present invention.

FIG. 3 illustrates a flowchart of a read operation of a flash memory device according to an embodiment of the present invention. Referring to FIG. 3, when a read command is inputted (step 310), a read operation is performed (step 320). The read command includes a command for reading a data area and a command for reading a FAT block. At step 330, it is determined whether the read operation is to be performed on the FAT block. As described above, this determination can be achieved by sensing if the flag cell is programmed. That is, when the flag cell is in a programmed state, this is considered as a read operation on the FAT block. On the other hand, when the flag cell is in a non-programmed state, this is considered as a read operation on the data area. At step 340, the output data is inverted when the FAT block is to be read. At step 350, the inverted data is outputted. On the other hand, the data is outputted without inversion, when the data area is to be read.

Figure 4:
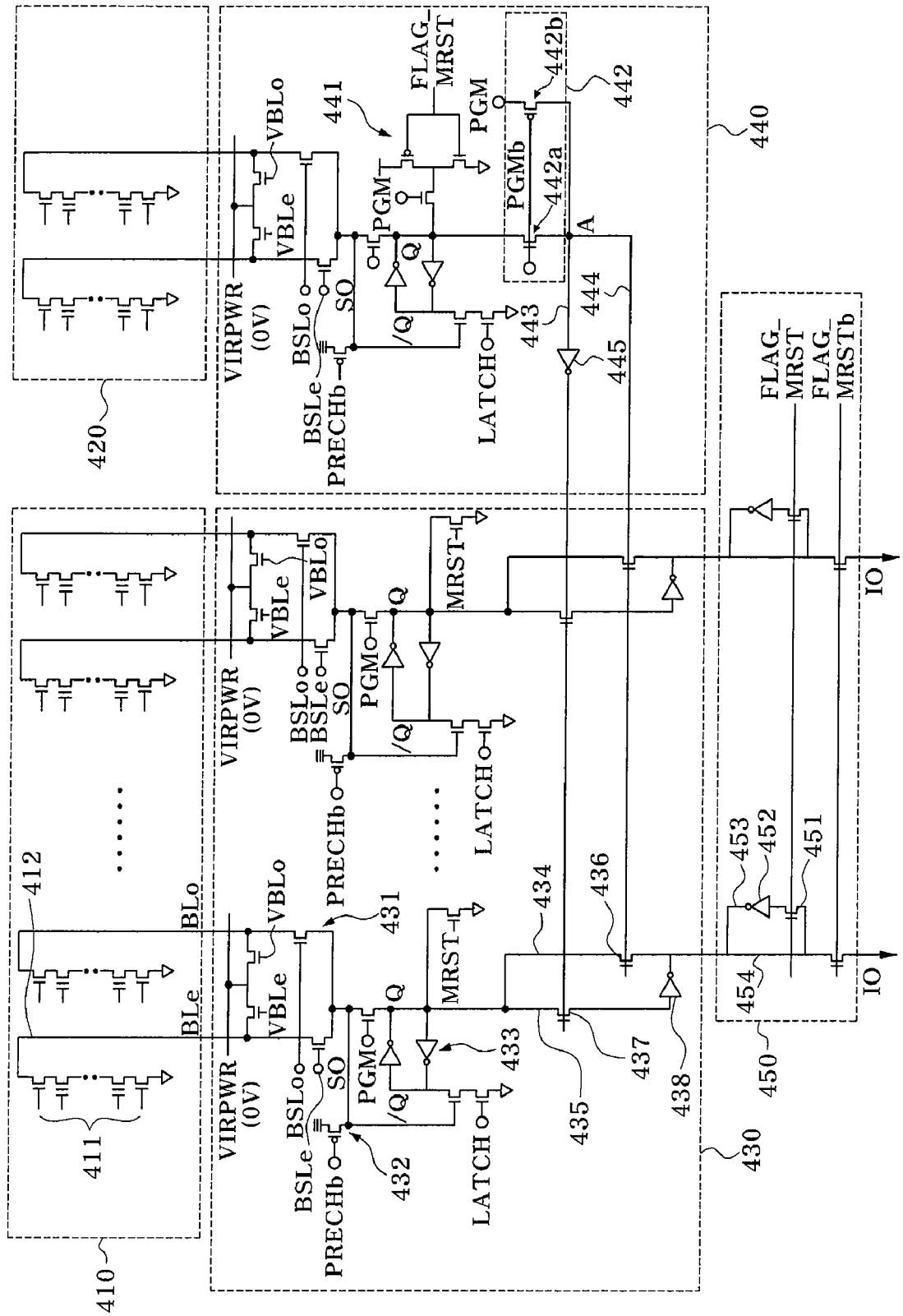
FIG. 4 illustrates a circuit diagram of a control circuit of a flash memory device according to an embodiment of the present invention.

FIG. 4 illustrates a circuit diagram of a control circuit of a flash memory device according to an embodiment of the present invention. The control circuit includes a flag cell array 420, a main page buffer 430, a flag cell page buffer 440, and a data inverter 450. The flag cell array 420 corresponds to memory cells of a main cell array 410. The main page buffer 430 controls an operation of the main cell array 410 and performs a latch operation. The flag cell page buffer 440 controls an operation of the flag cell array 420 and performs a latch operation. The data inverter 450 inverts an input data of the main page buffer 430.

The main cell array 410 includes a plurality of cell strings 411. Each of the cell strings 411 includes select transistors and memory cells connected in series. Each of the cell strings 411 is connected to a corresponding bit line 412 and is connected to the main page buffer 430 through the bit line 412. The bit line 412 includes an even bit line BLe and an odd bit line BLo in the present implementation. A pair of the even bit line BLe and the odd bit line BLo is connected to a single page buffer of the main page buffer 430. The flag cell array 420 has a similar cell string structure as the main cell array 410.

The main page buffer 430 includes a selecting/biasing unit 431, a precharging unit 432, and a latching unit 433. The selecting/biasing unit 431 selects one of the even bit line BLe and the odd bit line BLo and applies a bias voltage to the bit line 412. The precharging unit 432 precharges the bit line 412. The latching unit 433 latches data. The selecting/biasing unit 431, the precharging unit 432, and the latching unit 433 are connected through a sensing node S. The latching unit 433 is connected to an output node Q. The data inverter 450 is connected to the output node Q through first and second data input/output (I/O) lines 434 and 435. The first data I/O line 434 is switched by a transistor 436, and the second data I/O line 435 is connected to an inverter 438. Therefore, data is inverted through the second data I/O line 435.

The flag cell page buffer 440 has a similar configuration as the main page buffer 430. One difference is that a flag control signal unit 441 and a path control unit 442 are further provided. The flag control signal unit 441 determines the state of an output node (Q) of the flag cell page buffer 440 according to a flag control signal FLAG_MRST. The flag control signal FLAG_MRST is in a high state to program the FAT block, and is in a low state to program the data area. The path control unit 442 controls a data transfer path within the main page buffer 430 according to whether the flag cell 420 has been programmed. To this end, the path control unit 442 includes a first switch 442*a* and a second switch 442*b*. The first switch 442*a* is an n-channel MOS transistor and the second switch 442*b* is a p-channel MOS transistor. A control signal PGMb is commonly inputted to gates of the first and second switches 442*a* and 442*b*. The first switch 442*a* has a drain connected to the output node Q and a source connected to a node A. The second switch 442*b* has a drain receiving a control signal PGM and a source connected to the node A. The node A is connected to a first control line 443 and a second control line 444. The first and second control lines 443 and 444 control transistors 436 and 437 of the main page buffer 430. An inverter 445 is disposed on the first control line 443 to invert a state of the node A.

The data inverter 450 is connected to the main page buffer 430. The data inverter 450 includes a data input line 454 extending from the I/O line of the main page buffer 430. In addition, the data inverter 450 further includes a transistor 451, an inverter 452, and a data inversion input line 453. The transistor 451 is controlled by the flag control signal FLAG_MRST, and the inverter 452 is serially connected to the transistor 451. The data inversion input line 453 is connected to the inverter 452. When inputting data for program, if the flag control signal FLAG_MRST is in a high state, an input data is inverted by the inverter 452 and outputted through the data inversion input line 453. On the other hand, if the flag control signal FLAG_MRST is in a low state, data is transferred through the data input line 454 without inversion.

Figure 5:
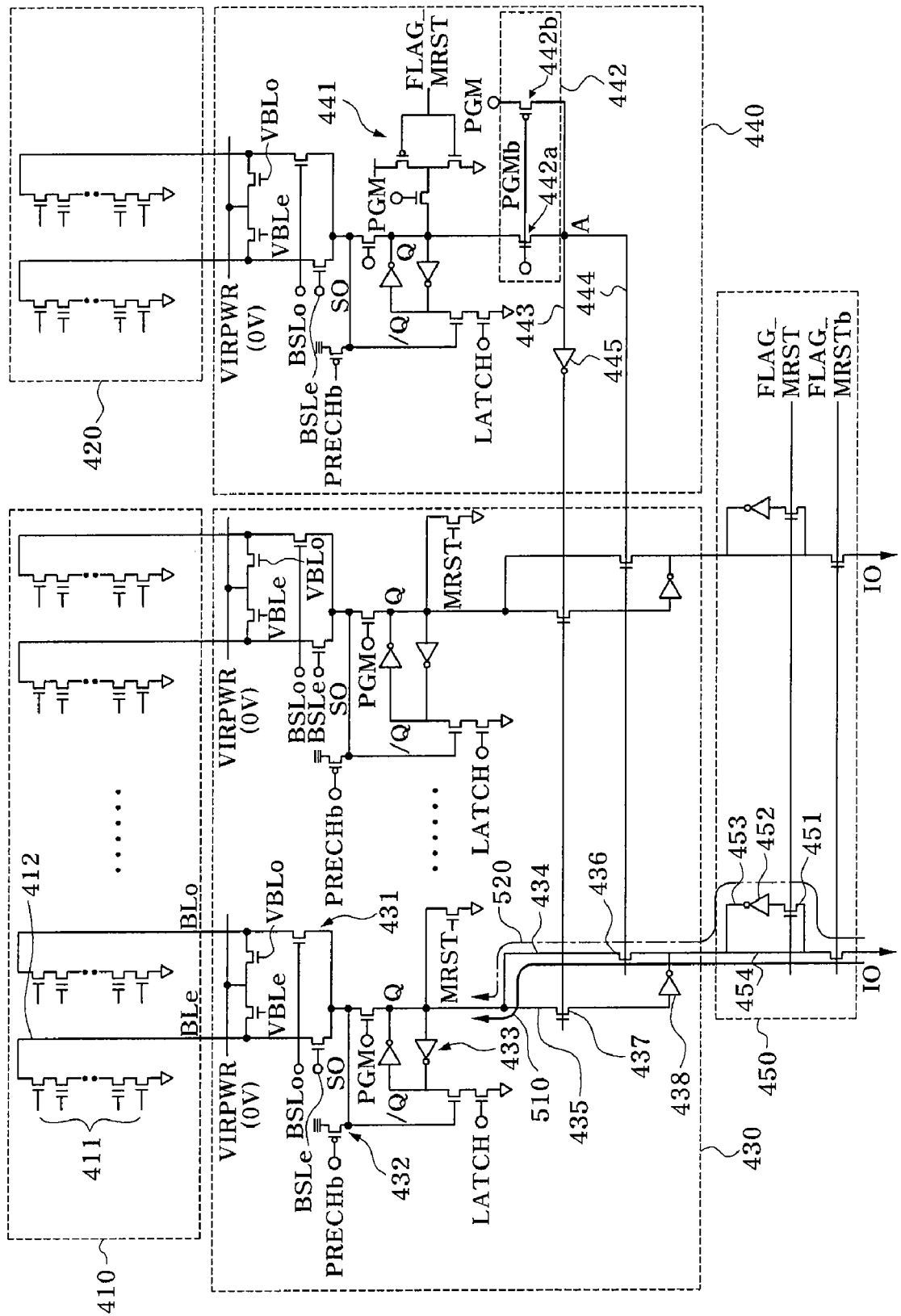
FIG. 5 illustrates a circuit diagram for explaining a program operation of the control circuit illustrated in FIG. 4.

FIG. 5 illustrates a circuit diagram for explaining a program operation of the control circuit illustrated in FIG. 4.

Referring to FIG. 5, in programming the data area, the program control signal PGM of a logic high level and the flag control signal FLAG_MRST of a logic low level are applied. The transistor 451 of the data inverter 450 is turned off so that data is inputted through the data input line 454. Since the flag control signal FLAG_MRST of the logic low level is applied, the output node Q of the flag cell page buffer 440 becomes a low state, but the node A becomes a high state due to the operation of the path control unit 442. Since the node A is in the high state, the transistor 436 of the main page buffer 430 is turned on. As indicated by an arrow 510, the data is inputted, without inversion, through the data input line 454 of the data inverter 450 and the first data I/O line 434 of the main page buffer 430. The program operation is performed on the main cell array 410 in units of pages according to the inputted data. Since the flag control signal FLAG_MRST of the logic low level is applied, the output node Q of the flag cell page buffer 440 becomes a high state.

In programming the FAT block, the program control signal PGM of a logic high level and the flag control signal FLAG_MRST of a logic high level are applied. Thus, the transistor 451 of the data inverter 450 is turned on so that the inverted data is inputted through the data inversion input line 453. Since the flag control signal FLAG_MRST is in the high state, the output node Q of the flag cell page buffer 440 becomes a low state, but the node A becomes a high state due to the operation of the path control unit 442. Since the node A is in the high state, the transistor 436 of the main page buffer 430 is turned on. As indicated by an arrow 520, the inverted data is inputted through the inversion input line 453 of the data inverter 450 and the first data I/O line 434 of the main page buffer 430. The program operation is performed on the main cell array 410 in units of pages according to the inverted data. Since the flag control signal FLAG_MRST of the logic high level is applied, the output node Q of the flag cell page buffer 440 becomes a low state and the flag cell 420 corresponding to the programmed page of the FAT block is programmed. In this way, since the inverted data is inputted in programming the FAT area, the data can be added to the FAT area by programming only the added data, without performing the erase operation on the overall FAT block.

Figure 6:
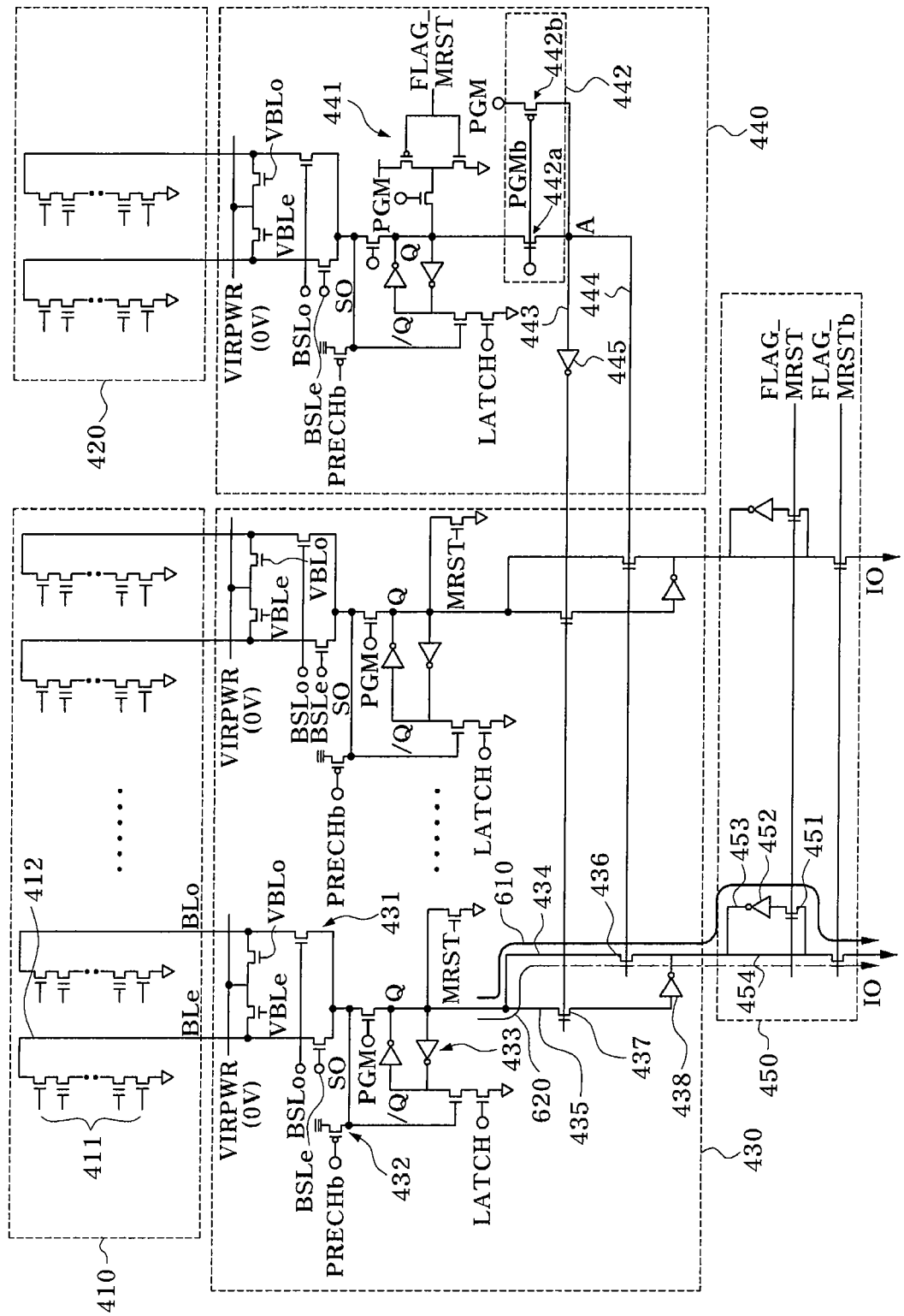
FIG. 6 illustrates a circuit diagram for explaining a read operation of the control circuit illustrated in FIG. 4.

FIG. 6 illustrates a circuit diagram for explaining a read operation of the control circuit illustrated in FIG. 4. Referring to FIG. 6, a read operation is performed according to a read command, the read data is stored in the output node Q of the main page buffer 430. During the read operation, the program control signal PGM of a logic low level and the flag control signal FLAG_MRST of a logic low level are applied. Thus, the transistor 451 of the data inverter 450 is turned off. If the output node Q of the flag cell page buffer 440 is in a high state, the read operation relates to the data area. In this case, the transistor 436 of the main page buffer 430 is turned on. As indicated by an arrow 610, the data is outputted, without inversion, through the first data I/O line 434 of the main page buffer 430 and the data input line 454 of the data inverter 450. If the flag cell 420 has been programmed and thus the output node Q of the flag cell page buffer 440 is in the low state, the read operation relates to the FAT block. In this case, the transistor 437 is turned on. As indicated by an arrow 620, the inverted data is outputted through the second data I/O line 435 of the main page buffer 430 and the data input line 454 of the data inverter 450.

In adding the data to the FAT area having the programmed state and the erased state the same as those of the data area, only the added data can be programmed without performing the erase operation by blocks, thereby improving the E/W cycling characteristic. Further, the data can be updated in the FAT area without performing the erase operation, thereby increasing the data update speed of the FAT area.

While the present invention has been described with respect to the specific embodiments, it will be apparent to those skilled in the art that various changes and modifications may be made without departing from the spirit and scope of the invention as defined in the following claims.

What is claimed is:

1. A method of operating a flash memory device, the method comprising:
   providing a flash memory device having a memory cell array and a flag cell array corresponding to memory cells of the memory cell array;
   receiving a program command, program data and a data type of the program data being associated with the program command, the data type comprising a first data type and file allocation data;
   determining whether the data type is the first data type or file allocation data;
   if the program data is file allocation data,
      inverting the program data, and
      programming the inverted program data into the memory cell array; and
   programming a cell of the flag cell array to record the data type of the program data when at least one of the data type is the first data type or file allocation data.

2. The method of claim 1, further comprising:
   if the program data is the first data type, programming the program data into the memory cell array without inverting the program data.

3. The method of claim 1,
   wherein the step of programming a cell of the flag cell array is accomplished when the data type is file allocation data.

4. The method of claim 1, further comprising:
   receiving a read command;
   performing a read operation according to the received read command to obtain read data from the memory cell array;
   determining the data type of the read data based on a state of a cell of the flag cell array corresponding to the read data; and
   if the data type of the read data is file allocation data,
      inverting the read data, and
      outputting the inverted read data.

5. The method of claim 4, further comprising:
   if the data type of the read data is the first data type, outputting the read data without inverting the read data.

6. A control circuit of a flash memory device, the control circuit comprising:
   a memory cell array having a plurality of memory cells, the memory cell array storing data comprising a first data type and file allocation data;
   a flag cell array having flag cells corresponding to memory cells of the memory cell array, the flag cell array recording data indicative of the data type of data stored in corresponding cells of the memory cell array;
   a flag cell page buffer configured to control an operation of the flag cells;
   a main page buffer configured to control an operation of the memory cells; and
   a data inverter configured to invert data inputted to the main page buffer when the data type of the data inputted to the main page buffer is file allocation data,
   wherein, when the data type of the data inputted into the main page buffer is file allocation data, the inverted data is programmed into the memory cells.

7. The control circuit of claim 6, wherein the data inverter comprises:
   a transistor configured to be switched in response to a flag control signal; and
   an inverter connected in series to the transistor.

8. The control circuit of claim 6, wherein the main page buffer comprises:
   a first data input/output line from which data read from the memory cells is outputted without inversion if the data type of the data read is the first data type; and
   a second data input/output line from which data read from the memory cells is outputted with inversion if the data type of the data read is file allocation data.

9. The control circuit of claim 8, further comprising:
   an inverter connected in series to the second data input/output line to invert the data.

10. The control circuit of claim 8, wherein the second data input/output line is connected if a corresponding flag cell of the flag cell array is in a programmed state.

11. A method of operating a flash memory device, the method comprising:
   providing a flash memory device having a memory cell array and a flag cell array corresponding to memory cells of the memory cell array, the memory cells storing data comprising a first data type and file allocation data;
   receiving a read command to read data from the memory cells;
   determining the data type of the data read from the memory cells based on a state of a corresponding flag cell of the flag cell array;
   if the data type of the data read is file allocation data, inverting the data read from the memory cells, and outputting the inverted read data.

12. The method of claim 11, further comprising:
   if the data type of the data read is the first data type, outputting the data read without inversion.

13. The method of claim 11, further comprising:
   receiving a program command, program data and the data type of the program data being associated with the program command;
   if the data type of the program data is file allocation data, inverting the program data, and
      programming the inverted program data into the memory cell array; and
   programming a cell of the flag cell array to record the data type of the program data when at least one of the program data is the first data type or the program data is file allocation data.

14. The method of claim 13, wherein the step of programming a cell of the flag cell array is accomplished when the program data is file allocation data.

15. The method of claim 13, further comprising:
   if the data type of the program data is the first data type, programming the program data into the memory cell array without inverting the program data.

\* \* \* \* \*